United States Patent [19]

Dydyk et al.

[11] Patent Number: 4,603,437
[45] Date of Patent: Jul. 29, 1986

[54] BALANCED MIXER

[75] Inventors: Michael Dydyk, Scottsdale; John K. Lauchner, Tempe; Lawrence J. Schumacher, Scottsdale, all of Ariz.

[73] Assignee: Motorola, Inc., Schaumburg, Ill.

[21] Appl. No.: 639,056

[22] Filed: Aug. 9, 1984

[51] Int. Cl.⁴ .............................................. H04B 1/26
[52] U.S. Cl. .................................... 455/327; 455/330
[58] Field of Search ....................... 455/302, 325–327, 455/330

[56] References Cited
U.S. PATENT DOCUMENTS 4,031,472  6/1977  Shinkawa et al. ................... 455/327
4,420,839 12/1983  Hogerheiden, Jr. ................. 455/327

Primary Examiner—Jin F. Ng
Attorney, Agent, or Firm—Raymond J. Warren

[57] ABSTRACT

An apparatus and method is disclosed for a balanced mixer having a fifth port capable of removing the intermediate frequency and the upper sideband frequency while acting as an open circuit to the RF and local oscillator input signals. The upper sideband signal is then dissipated in a distributed load designed so as not to reflect the upper sideband signal back into the transmission ring. Thus, a balanced mixer is disclosed that provides IF signals and removes other unwanted signals without corrupting later signals.

19 Claims, 1 Drawing Figure

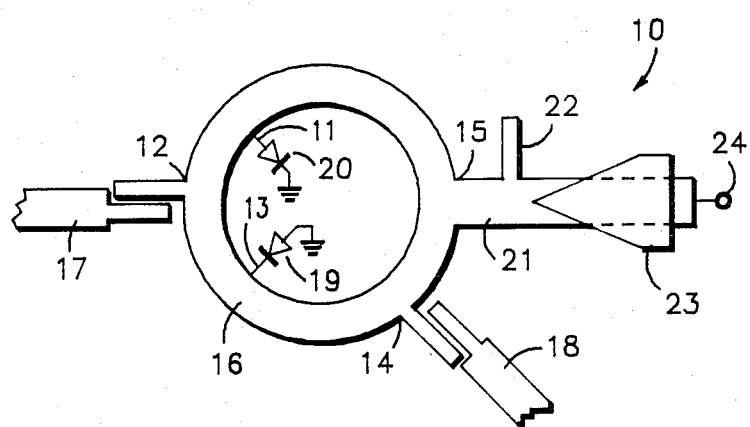

BALANCED MIXER

BACKGROUND OF THE INVENTION

1. Field of the Invention

This invention relates, in general, to a balanced mixer, and, more particularly, to a balanced mixer for use in RF frequencies.

2. Description of the Background

Currently in a typical microwave/millimeter wave down converter the detection bandwidth determining receiver sensitivity is set by filtering at the first IF amplifier input. The filter acts as a resistive match at the lower sideband and is reactive at the upper sideband. As a result the upper sideband is reflected back into the IF port of the mixer where it is combined again with the local oscillator (LO) frequency of the mixer to produce a signal having a $2F_{LO}+F_{RF}$ DC term and a $F_{LO}+F_{RF}-F_{LO}$ AC term (the original RF frequency). This effects the conversion loss and the RF port VSWR, depending on the phase of the reflective signal. The conversion loss may be as great as 6 dB. The DC term further degrades the two-tone intermodulation performance by as much as 20 dB. For down converters operating below 3 to 5 GHz, the resistive match to both sidebands at the mixer output can be separatly achieved utilizing complementary filters at the upper and lower sideband frequencies. For down converters operating above this range where the frequency spread between the lower and upper sidebands is rapidly increasing this approach does not work effectively. The upper sideband frequency that is reflected back into the mixer can create an additional mismatch and two-tone intermodulation results in a degradation of the RF signal and a corresponding corruption of the IF signal.

SUMMARY OF THE INVENTION

Accordingly, it is an object of the present invention to provide a balanced mixer having an improved RF port VSWR.

A further object of the present invention is to provide a balanced mixer having lower two tone intermodulation performance.

Still another object of the present invention is to provide a balanced mixer having a large dynamic range.

Yet another object of the present invention is to provide a balanced mixer having no conversion loss variation.

Yet another object of the present invention is to provide a balanced mixer having a limited phase and amplitude variation.

Yet another object of the present invention is to provide a balanced mixer having mass producibility.

Yet another object of the present invention is to provide a balanced mixer being more economical to produce.

The above and other objects and advantages of the present invention are provided by an apparatus and method of removing the upper sideband signal without effecting the operation of the mixer.

A particular embodiment of the present invention comprises an apparatus and method of adding a fifth port to a standard mixer, this fifth port is to be located approximately equal distance from the diode ports. The fifth port is designed to act as an open circuit for the RF and LO signals and to dissipate the upper sideband without reflecting it back to the mixer. This then allows only the IF signal to pass out of the mixer.

BRIEF DISCUSSION OF THE DRAWING

The single FIGURE is a schematic diagram of a balanced mixer embodying the present invention.

DETAILED DESCRIPTION OF THE DRAWING

Referring to the FIGURE a schematic diagram of a balanced mixer embodying the present invention, generally designated 10, is illustrated. Balanced mixer 10 consists of a ring 16 having five ports designated 11 through 15. Coupled lines were used to coupled port 12 to either an RF or LO transmission strip 17 and to couple Port 14 to the other of the RF or LO transmission strip 18. The RF signal is transmitted to one of ports 12 and 14 and the LO signal is transmitted to the other. Port 13 is coupled to the cathode of a diode 19, the anode of which is coupled to ground. Port 11 is coupled to the anode of diode 20, the cathode of which is coupled to ground. Port 15 is coupled to a transmission line 21. Transmission line 21 is coupled to a transmission line 22 and is covered by a distributed load 23. The end of transmission line 21 is coupled to IF port 24.

In operation balanced mixer 10 receives an RF signal from transmission line 17 at port 12 and an LO signal from a local oscillator along transmission line 18 at port 14. Ports 11 and 13 are spaced one-fourth wave length from port 12. This results in the RF signal received at port 12 being equally divided between diode 19 and 20 at ports 13 and 11, resp. The LO signal received is also transmitted to diodes 19 and 20 at ports 13 and 11, resp. Port 14 is spaced three-fourths wavelength, at the LO frequency, from port 11 and one-fourth wavelength at the LO frequency from port 13. The one-half wavelength difference in distance between the two ports produces an LO signal at port 11 which is 180° out of phase from the LO signal received at port 13. When the LO and RF signals are combined in diodes 19 and 20 the two resulting signals will be 180° out of phase from each other because of the phase difference in the LO signals. For this reason one of the diodes is reversed, as indicated, thereby changing the phase of the output of that diode by 180° and placing the two resulting signals in phase. In diodes 19 and 20 signals are produced that have several components, only one of which is desired. These diodes produce an $LO^2$ (or $LO \times LO$) signal, an $RF^2$ (or $RF \times RF$) signal and an upper side band signal, all of which are undesirable, and a lower sideband signal, IF, which is desirable. The $LO^2$ and $RF^2$ signals are eliminated if the position of ports 11 and 13 are properly matched, thus leaving the IF signal.

The next step is to remove the IF signal without removing the upper sideband signal and without reflecting the upper sideband back into the mixer. This is accomplished through the addition of port 15. Port 15 is placed approximately equal distance from ports 11 and 13 so as to receive signals that are in phase. However, it should be understood that the exact placing of port 15 is not critical. The placing of port 15 may deviate slightly and still provide satisfactory results at the higher frequencies at which this devise is designed to be used. This variability in construction allows the balanced mixer to be mass produced and provides a more economical mixer. Transmission line 21 is coupled to port 15 for the removal of the IF signal. Transmission line 21, if simply coupled to port 15 without anything else, would also remove the RF, LO and upper sideband signals. By coupling transmission line 22 to transmission line 21 the RF and LO signals are not transmitted through line 21. Line 22 is approximately one-fourth wavelength along at the RF frequency, and spaced one-fourth wavelength at the RF frequency, from port 15. This, in effect, provides an open circuit on line 22 opposite line 21 which provides a short circuit at line 21 where connected to line 22 which inturn provides an open circuit at port 15 for the RF and LO signals, as the frequency of the LO signal is close to that of the RF signal, and prevents them from being transmitted through line 21. This leaves the IF and upper sideband signals to be transmitted on line 21. The upper sideband signal is dissipated in distributed load 23. Load 23 is placed over line 21 and is tapered in order to match the impedance of line 21. The length of load 23 is set to be approximately one half wavelength, at the upper sideband frequency which will prevent the upper sideband from being reflected back into the mixer. Since the frequency of the IF signal is very small when compared to the upper sideband the IF signal will be passed through. Load 23 will cause a slight amount of loss in the IF signal, however, this loss is negligible.

The RF and LO inputs of lines 17 and 18 use coupled lines to prevent the IF and upper sideband signals from being transmitted back through ports 12 and 14. Theoretical analysis of this type of mixer shows that the upper sideband signals should cancel at ports 12 and 14 if diodes 19 and 20 are identical. From a practical standpoint it is not possible to have two identical semiconductors. Therefore, it is necessary to decouple the upper sideband energy from ports 12 and 14 and force it into port 15 where it may be dissipated. This is accomplished through a coupled line DC block which provides an open circuit to the upper sideband as well as the IF signals. This then allows the RF and LO signals to enter the mixer but prevents the IF and upper sidebands from exiting along ports 12 and 14 from the mixer.

Thus, it is apparent that it has been provided, in accordance with the invention, a device and method that fully satisfies the objects, aims and advantages set forth above.

It has been shown that the present invention provides an improved RF port VSWR; lower two-tone intermodulation properties; larger dynamic range; no conversion loss variation; limited phase and amplitude variations; and is reproducible in a more economical manner.

It is to be understood that while the present invention was designed for use in higher RF applications, that this apparatus will also operate effectively at lower signal levels.

While the invention has been described in conjunction with specific embodiments thereof, it is evident that many alterations, modifications and variations will be apparent to those skilled in the art in light of the foregoing description. Accordingly it is intended to embrace all such alternatives, modifications and variations in the appended claims.

We claim:

1. A balanced mixer device for receiving an RF signal and a local oscillator (LO) signal and producing an intermediate frequency (IF) signal comprising:
   a transmission ring having first, second, third, fourth, and fifth ports, said first port being coupled to receive said RF signal, said third port being coupled to receive said LO signal and said fifth port being coupled to provide said IF signal;
   a first input having a first end and a second end, said first end being coupled to said first port of said transmission ring and said second end being coupled to receive said RF signal;
   a second input having a first end and a second end, said first end being coupled to said third port of said transmission ring and said second end being coupled to receive said LO signal;
   first IF generating means for providing said IF signal, said first IF generating means having a first end and a second end, said first end being coupled to said second port of said transmission ring and said second end being coupled to ground;
   second IF generating means for providing said IF signal, said second IF generating means having a first end and a second end, said first end being coupled to said fourth port of said transmission ring and said second end being coupled to said ground;
   a transmission line having a first end and a second end, said first end being coupled to said fifth port of said transmission ring and said second end being coupled to provide said IF signal;
   a transmission stub having a first end and a length, said first end being coupled to said transmission line a distance from said fifth port of said transmission ring; and
   load means for removing an upper sideband signal, said load means having an impedance, said impedance matching an impedance of said transmission line and said load means having a length of one-half the wavelength of said upper sideband signal.

2. The balanced mixer of claim 1 wherein said first end of said first input is coupled using coupled lines to said first port of said transmission ring.

3. The balanced mixer of claim 2 wherein said first end of said second input is coupled using coupled lines to said third port of said transmission ring.

4. The balanced mixer of claim 3 wherein said first IF generating means comprises a diode having an anode and a cathode, said cathode being coupled to said second port of said transmission ring and said anode being coupled to said ground.

5. The balanced mixer of claim 4 wherein said second IF generating means comprises a diode having a cathode and an anode, said anode being coupled to said fourth port of said transmission ring and said cathode being coupled to said ground.

6. The balanced mixer of claim 5 wherein said length of said transmission stub is one-fourth of a wavelength of said RF signal.

7. The balanced mixer of claim 6 wherein said distance said transmission stub is placed from said fifth port of said transmission ring is one-fourth of a wavelength of said RF signal.

8. A method of providing an intermediate frequency (IF) signal from a balanced mixer comprising the steps of:
   providing an RF signal at a first port of a transmission ring;
   providing a local oscillator (LO) signal at a third port of said transmission ring;
   combining said RF and said LO signals in a first and a second diode coupled to a second and fourth port, respectively, of said transmission ring, each diode producing a resulting signal having an $RF^2$ (or $RF \times RF$) component, a $LO^2$ (or $LO \times LO$)

component, an IF component and an upper sideband component;

changing the phase of one of said resulting signals from said first and second diodes by 180° by way of inverting the direction of one of said first and second diodes;

transmitting said resulting signals from said first and second diodes back to said transmission ring;

combining said resulting signals from said first and second diodes causing the $RF^2$ and $LO^2$ signals of said resulting signals to be cancelled;

removing said IF and said upper sideband signals from said transmission ring through a transmission line at a fifth port, said fifth port being spaced substantially equal distance from said second and said fourth ports;

preventing the transmission of said RF and LO signals through said fifth ports of said transmission ring by spacing a transmission stub of a predetermined length, a predetermined distance from said fifth port on said transmission line;

removing said upper sideband signal from said transmission line without reflecting said upper sideband signal back to said transmission ring and leaving said IF signal; and transmitting said IF signal to an output of said balanced mixer.

9. The method of claim 8 wherein said step of providing an RF signal comprises the step of using coupled lines to couple an RF transmission line to said first port of said transmission ring.

10. The method of claim 9 wherein said step of providing an LO signal comprises the step of using coupled lines to couple an LO transmission line to said third port of said transmission ring.

11. The method of claim 10 wherein said step of removing the upper sideband signal from said transmission line comprises the step of transmitting said upper sideband signal into a distributed load having a length equivalent to one-half of a wavelength of said upper sideband signal.

12. The method of claim 11 wherein said predetermined length of said transmission stub is substantially one-fourth wavelength of said RF signal.

13. The method of claim 12 wherein said predetermined distance of said transmission stub from said transmission ring is substantially one-fourth wavelength of said RF signal.

14. A balanced mixer device having an RF input, a local oscillator (LO) input and a intermediate frequency (IF) output, comprising:

a transmission ring having first, second, third, fourth, and fifth ports, said first port being coupled to said RF input of said balanced mixer and said third port being coupled to said LO input of said balanced mixer;

a first nonlinear device for mixing RF and LO signals to produce upper sideband and IF signals in said transmission ring, said first nonlinear device being coupled to said second port of said transmission ring;

a second nonlinear device for mixing RF and LO signals to produce upper sideband and IF signals in said transmission ring, said second nonlinear device being coupled to said fourth port of said transmission ring, and means coupling the IF output to said fifth port of said transmission ring, said means including RF and LO signal blocking means for preventing the passage of the RF and LO signals from said transmission ring through said fifth port and said means further including dissipating means for dissipating the upper sideband signal.

15. The balanced mixer of claim 14 wherein said RF and LO signal blocking means comprises:

a transmission line coupling said fifth port of said transmission ring to said IF output of said balanced mixer; and a transmission stub having a length substantially equivalent to one-fourth wavelength of said RF signal, said transmission stub being coupled to said transmission line a distance from said transmission ring, said distance being substantially equivalent to one-fourth wavelength of said RF signal.

16. The balanced mixer of claim 15 wherein said upper sideband signal dissipating means comprises a load for removing said upper sideband signal, said load having an impedance and a length, said impedance matching an impedance of said transmission line and said length being substantially one-half the wavelength of said upper sideband signal.

17. The balanced mixer of claim 16 wherein said first nonlinear device consists of a diode having a cathode and an anode, said cathode being coupled to said second port of said transmission ring and said anode being coupled to ground.

18. The balanced mixer of claim 17 wherein said second nonlinear device consists of a diode having a cathode and an anode, said anode being coupled to said fourth port of said transmission ring and said cathode being coupled to said ground.

19. The balanced mixer of claim 18 wherein said first and second ports are capacitively coupled to said RF and LO inputs, respectively.

* * * * *